(12) United States Patent
Wang

(10) Patent No.: US 6,362,763 B1
(45) Date of Patent: Mar. 26, 2002

(54) METHOD AND APPARATUS FOR OSCILLATION RECOVERY IN A DELTA-SIGMA A/D CONVERTER

(75) Inventor: Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/663,535

(22) Filed: Sep. 15, 2000

(51) Int. Cl.[7] .............................. H03M 3/00; G06F 7/64; G06G 7/18; G06G 7/19
(52) U.S. Cl. ..................... 341/143; 327/337; 327/345
(58) Field of Search ............................. 327/337, 345; 341/143, 94, 155; 330/9

(56) References Cited

U.S. PATENT DOCUMENTS

| 5,012,244 A | | 4/1991 | Wellard et al. ............. 341/143 |
| 5,023,612 A | * | 6/1991 | Liu ............................... 341/94 |
| 5,977,895 A | | 11/1999 | Murota et al. .............. 341/143 |
| 6,040,793 A | * | 3/2000 | Ferguson et al. ........... 341/143 |
| 6,061,009 A | * | 5/2000 | Krone et al. ................ 341/143 |
| 6,064,326 A | | 5/2000 | Krone et al. ................ 341/143 |

OTHER PUBLICATIONS

"Delta–Sigma Data Converters—Theory, Design, and Simulation" edited by Steven R. Norsworthy, Richard Schreier and Gabor C. Temes, IEEE Press pp. 183–185, p. 190.

* cited by examiner

Primary Examiner—Patrick Wamsley
(74) Attorney, Agent, or Firm—W. Daniel Swayze, Jr.; W. James Brady; Frederick J. Telecky, Jr.

(57) ABSTRACT

A method and apparatus for recovering from an unstable oscillating condition in a delta-sigma A/D converter modulator circuit. A modulator circuit is disclosed having integrator stages, each having a first switch across the input terminals of the integrator stage and a second switch across the output terminals of the integrator stage. In another embodiment of the invention, the integrator stage comprises a differentially structured operational amplifier having a first restore switch coupled across the input terminals, a second restore switch across the output terminals, and four disconnect switches, one each coupled between the operational amplifier inputs and ends of the first restore switch and between the operational amplifier outputs and ends of the second restore switch. In operation, an unstable condition detector monitors an output of the A/D modulator circuit and generates a restore signal to the integrator stages upon detection of an unstable condition. Upon receipt of the restore signal, each of the restore switches closes and each of the disconnect switches opens to effectively isolate integrating capacitors for each of the integrator stages from the operational amplifiers of the respective integrator stages.

18 Claims, 5 Drawing Sheets

METHOD AND APPARATUS FOR OSCILLATION RECOVERY IN A DELTA-SIGMA A/D CONVERTER

BACKGROUND OF THE INVENTION

1. Field of the Invention

The present invention relates generally to a delta-sigma modulator for use with an analog-to-digital converter. More particularly, the present invention relates to the use of a delta-sigma modulator with circuitry to detect instabilities in the modulator and to restore the modulator to a stable operating condition.

2. State of the Art

The general technique of providing analog-to-digital ("A/D") conversion of signals is well known in the art. Generally, the sampling rate required to sample an analog signal for A/D conversion must be twice the highest frequency component being sampled. This rate is commonly known as the Nyquist rate. More recently, oversampling methods have been used to sample at a rate much higher than the Nyquist rate. An advantage of using oversampling techniques is in the precision provided by the converter. With converters operating under the Nyquist rate for sampling, a higher amount of component precision and matching is required for the conversion than with converters operating under oversampling rates.

One well-known type of oversampling A/D conversion technique uses a modulator commonly referred to as a delta-sigma modulator. In an A/D converter using a delta-sigma modulator including integrator(s), comparator(s) and a digital-to-analog converter ("DAC") in the feedback path, a low-pass decimation filter is used following the modulator to provide necessary filtering. The analog input is modulated to a digital bit stream, typically several bits wide.

As shown in the block diagram of FIG. 1, a delta-sigma modulator 2 receives an input 4 and produces an output 6. A delta-sigma modulator 2 may include one or more integration stages 8 and 10. Feedforward paths a1 and a2 are provided from the outputs of each integration stage 8 and 10 to a first summing junction 12 on the non-inverting input to a comparator 14. A feedback path 15 includes a DAC b and extends between the output 6 and a second summing junction 16.

Typically, it is desirable in the design of a delta-sigma modulator to reduce quantization noise. Reduction of quantization noise may be achieved by the selection of a transfer function for the overall modulator that possesses high in-band gain and high out-of-band attenuation, thereby shaping the quantization noise spectrum advantageously. To appropriately shape the overall modulator transfer function, one or more additional integration stages are included within the modulator circuitry, thereby increasing the order of the modulator.

Despite the advantages of higher order modulators, they are well known to be only conditionally stable. All high order modulators become unstable for inputs that exceed certain bounds. Instability may also occur after power-on since operational amplifier ("op-amp") integrators with arbitrary initial states may place the modulator in an unstable region of its state space. In the case of a large input exceeding a stability threshold, even when the input is brought back below the stability threshold, oscillation may still persist. Therefore, a means for detecting instability and restoring the loop back to a stable condition is necessary in higher order modulators.

One approach to correcting the instability found in higher order modulators (three or more integration stages) is to use state-variable clamping techniques. FIG. 2 shows an integration stage 18 of a modulator including an op-amp 20 having an integration capacitor 22 and a limiter 24 coupled between the non-inverting input and the output of the op-amp 20. A non-linear element, such as a limiter, coupled across the integrating capacitor 22 prevents large values from appearing at the integrator output. Typically, for a higher order modulator circuit, the non-linear elements are set to turn "ON" at about 20–50% higher than the peak-to-peak integrator swings. One example of a limiting scheme implemented in an integrator stage is shown in U.S. Pat. No. 5,977,895 to Murota et al. (Nov. 2, 1999), entitled "WAVEFORM SHAPING CIRCUIT FOR FUNCTION CIRCUIT AND HIGH ORDER DELTA SIGMA MODULATOR." For the approach shown in Murota et al., however, the input signal at each stage must be limited to a few hundred millivolts to maintain stability. As a result, the first stage integrator capacitor tends to be very large relative to the input capacitor. In a high performance A/D modulator design where input capacitors are relatively large, the addition of an even larger first stage integration capacitor results in an area- and power-intensive circuit.

Another approach to overcoming loop stability problems in higher order modulators is to detect an overload condition and degrade the performance of the modulator by changing the modulator integrator coefficients of operation. An example of this approach is disclosed in U.S. Pat. No. 6,064,326 to Krone et al. (May 16, 2000), entitled "ANALOG-TO-DIGITAL CONVERSION OVERLOAD DETECTION AND SUPRESSION." Although this approach apparently does not destroy the information stored on the integrators, it does require additional switched capacitors and switch branches to implement.

Yet another approach to solving instability problems in higher order modulators is to sense instability and to responsively reset the circuit to a known state. There are two conventional methods of sensing instability: 1) Looking for integrator input values above a certain value using a comparator; and 2) Looking for long strings of 1s or 0s in the digital bit stream.

U.S. Pat. No. 5,012,244 to Wellard et al. (Apr. 30, 1991), entitled "DELTA-SIGMA MODULATOR WITH OSCILLATION DETECT AND RESET CIRCUIT," includes an example of the first method of sensing instability for higher order modulators. FIG. 3, herein, is similar to that shown in FIG. 1 of the Wellard et al. patent and shows a circuit in which a fourth order delta-sigma modulator 30 uses an oscillation detect comparator 32 to detect instability in the signal at the output of the second integrator 36. If instability is detected, the oscillation detect comparator 32 resets the circuit by short-circuiting the outputs of each of the four integrators 34, 36, 38 and 40 with its respective input by closing a switch 42, 44, 46 and 48 coupled across each of the integrators 34, 36, 38 and 40.

FIG. 4 includes a more detailed diagram of a single integrator stage 50 of the prior art delta-sigma modulator circuit of FIG. 3. Each stage 50 includes an integrating capacitor 52 and a switch 54 coupled in parallel between the output 56 and an input 58 of an op-amp 60. The op-amp 60 shown in FIG. 4 is configured as a single-ended structure, meaning it has only a single output, rather than as a differential-ended structure, meaning it has two outputs. Both singular and differential structures for op-amps are well known in the art.

For the modulator circuit shown in FIG. 3 and the integrator shown in FIG. 4, resetting the integrators 34, 36, 38 and 40 by closing the switches 42, 44, 46 and 48 returns all four integrators 34, 36, 38 and 40 to known, stable states. However, resetting the integrators 34, 36, 38 and 40 in this manner also eliminates any common mode information stored between the inputs and outputs of the integrators 34, 36, 38 and 40 by shorting the integrating capacitors.

Therefore, there is a need for an A/D modulator circuit which overcomes the stability problems experienced by higher order modulator circuits of the prior art, without losing all of the information stored by the modulator integrator stages.

SUMMARY OF THE INVENTION

It is an object of the invention to have an A/D modulator circuit which overcomes the stability problems experienced by prior art higher order modulator circuits.

It is another object of the invention to have a high order delta-sigma modulator circuit which is capable of retaining stored common mode information throughout a restore operation.

The present invention provides a higher order (three or more integrator stages) A/D modulator circuit which overcomes an unstable condition through a restore operation while maintaining common mode information stored in each of the integrator stages. As used herein, the term "restore" is intended to refer to placing the circuit in a stable condition which may include, but is not limited to, placing the circuit in an original state or placing the circuit in another stable state. A restore operation may include resetting the inputs and outputs of each integrator stage to zero, or may more preferably include re-distributing the charges on the integrating capacitors to place the integrator stage to a stable condition while maintaining the common mode information across the integrator stage. According to an embodiment of the invention, an integrator stage of an A/D modulator circuit comprises a differentially structured operational amplifier having a first restore switch coupled between the inputs of the operational amplifier, and a second restore switch coupled between the outputs of the operational amplifier. A first integrating capacitor is coupled between the inverting input and the non-inverting output of the operational amplifier, and a second integrating capacitor is coupled between the non-inverting input and the inverting output of the operational amplifier.

During operation, the integrating capacitor stores data prior to the operational amplifier becoming unstable. Through an unstable condition detector, the A/D modulator circuit determines that the circuit is unstable and generates a restore signal to each of the switches within the integrator stages of the modulator circuit. The switches across the inputs and outputs of each of the operational amplifiers activate to a closed position in response to the restore signal and remain closed for a predetermined period until the modulator circuit has been restored to a stable condition. Because the switches do not short-out the integrating capacitors, as is conventional in prior art integrator stages, but rather combine the two integrating capacitor branches, the differential voltage respectively between the inputs and between the outputs of the operational amplifier is effectively removed while maintaining the common mode voltage across each of the integrating capacitors.

In another embodiment of the invention, in addition to the switches across the inputs and outputs of the operational amplifiers, an integrator stage comprises a disconnect switch between each of the inputs and outputs of the operational amplifier and, respectively, the first and second restore switches, to isolate the operational amplifier during a restore operation. Upon receiving a restore signal, the restore switches activate to a closed position and the disconnect switches activate to an open position.

An unstable condition detector is also disclosed in conjunction with embodiments of the invention. The unstable condition detector monitors the output of the A/D modulator circuit and generates a restore signal when an unstable condition is detected. In one embodiment, the unstable condition detector is configured as a 4-bit counter for monitoring series of consecutive 1s and 0s and generating a restore signal when the number of consecutive 1s or number of consecutive 0s reaches sixteen.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the drawings herein, wherein:

DETAILED DESCRIPTION OF THE INVENTION

Figure 5:
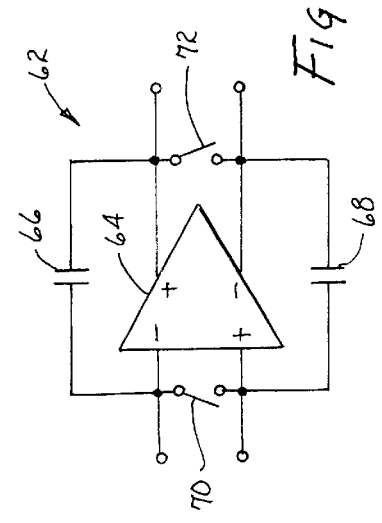
FIG. 5 is a diagram illustrating an integrator stage for a delta-sigma modulator according to a first embodiment of the present invention.

FIG. 5 illustrates an integrator stage, without the input switched-capacitor branch, for a delta-sigma modulator of an A/D converter circuit according to a first embodiment of the present invention. The integrator stage 62 of FIG. 5 comprises a differentially structured op-amp 64 having inverting and non-inverting inputs, and inverting and non-inverting outputs. Similar to other known integrator stages, the integrator stage 62 comprises a first integrating capacitor 66 coupled between the inverting input and the non-inverting output, and a second integrating capacitor 68 coupled between the non-inverting input and the inverting output. Distinct from known integrator stages, however, the integrator stage of this first embodiment includes a first restore switch 70 coupled between the inverting and non-inverting inputs, and a second restore switch 72 coupled between the inverting and non-inverting outputs. In operation, when the integrator stage 62 receives a restore signal, the first and second restore switches 70 and 72 are activated to a closed state to place the integrator stage in a stable, known state. Because the restore switches 70 and 72 are coupled, respectively, between the inputs and the outputs rather than across each of the integrating capacitors 66 and 68, rather than eliminating the common mode voltage across the integrating capacitors 66 and 68, the charge corresponding to the common mode voltage is redistributed between the integrating capacitors 66 and 68 to remove the differential voltage between the inputs and between the outputs of the op-amp 64.

For conventional delta-sigma modulator circuits, such as that disclosed by Wellard, et al. (U.S. Pat. No. 5,012,244), upon completion of a reset operation, the common mode voltage of the input stage is the same as the common mode voltage of the output stage. However, for some op-amp topologies, the input common mode voltage of the op-amp is required to be different than the output common mode voltage for the op-amp to operate properly. When the input and output common mode voltages are the same, it may take a number of cycles of operation for the input common mode voltage to attain a necessary level for normal operation. Contrarily, with the embodiments of the present invention disclosed herein, the oscillation recovery is completed immediately upon completion of the restore operation without disturbing the input common mode voltage. In this way, the delta-sigma modulator circuit will return to normal operation immediately upon completion of the restore operation.

Figure 1:
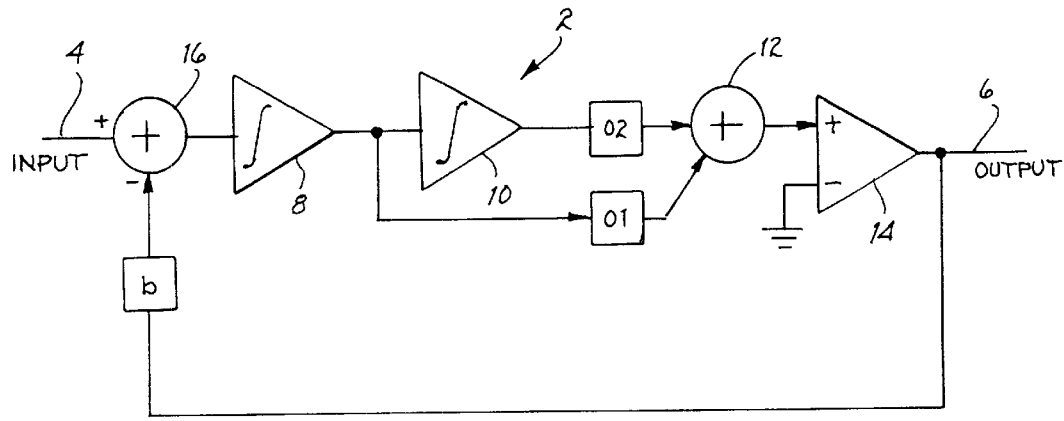
FIG. 1 is a diagram of a prior art delta-sigma modulator circuit for an A/D converter.
Figure 2:
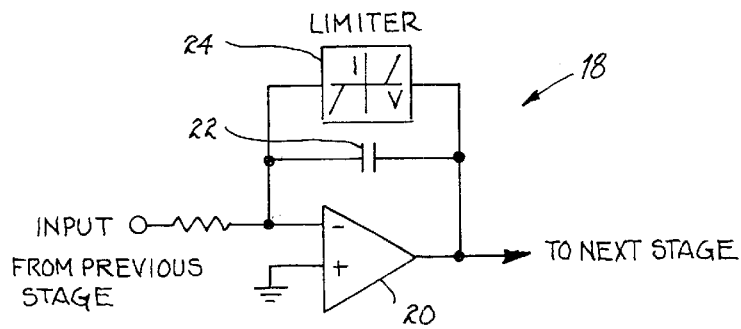
FIG. 2 is a diagram of a prior art integrator stage for a delta-sigma modulator having a voltage limiter coupled across an input and output.
Figure 4:
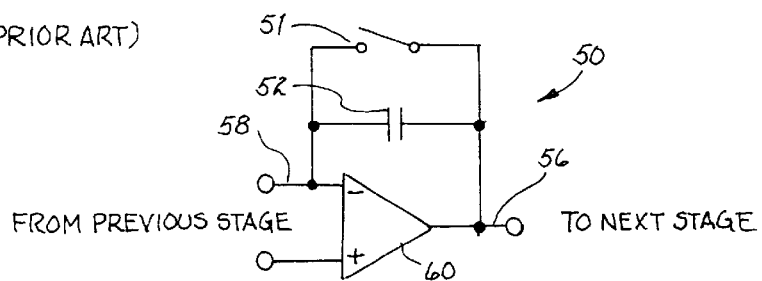
FIG. 4 is a diagram of a prior art integrator stage for the delta-sigma modulator of FIG. 3.
Figure 3:
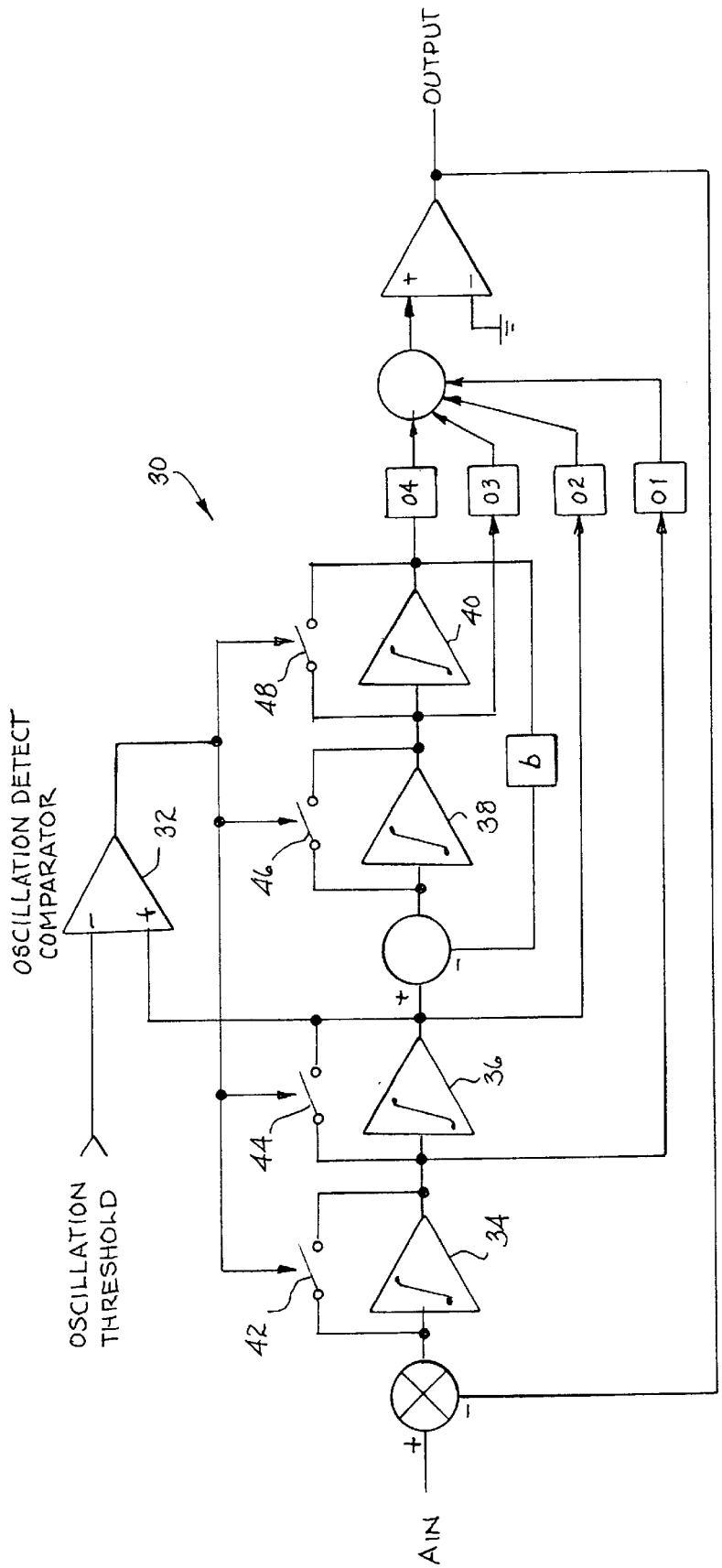
FIG. 3 is a diagram of a prior art implementation of a delta-sigma modulator.
Figure 6:
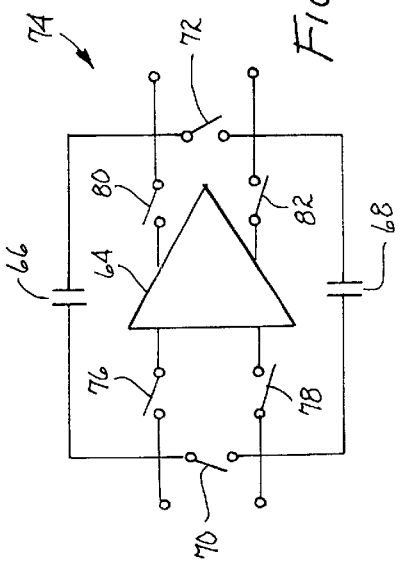
FIG. 6 is a diagram illustrating an integrator stage for a delta-sigma modulator according to a second embodiment of the present invention.

For certain op-amp topologies, in addition to the restore switches respectively coupled across the inputs and outputs of the op-amp, disconnect switches to isolate the inputs and outputs of the op-amp from surrounding circuitry are preferable. FIG. 6 illustrates a second embodiment of an integrator stage for a delta-sigma modulator of an A/D converter circuit. In addition to the elements of the integrator stage shown in FIG. 5, the integrator stage 74 shown in FIG. 6 includes four disconnect switches 76, 78, 80 and 82 which open when the integrator stage 74 receives a restore signal. By activating the disconnect switches 76, 78, 80 and 82 to an open state and activating the restore switches 70 and 72 to a closed state during a restore operation, the op-amp 64 is isolated from surrounding circuitry. If the op-amp 64 is not isolated from surrounding circuitry during a restore operation, large current amounts may flow through the outputs of the op-amp 64 due to offset. Because the excess current flow through the op-amp outputs results in unnecessary power consumption, by isolating the op-amp 64, power is preserved. This configuration is particularly advantageous for class AB op-amps which are capable of much larger output currents in relation to input currents than class A op-amps which have fixed output currents regardless of the input current.

Figure 7:
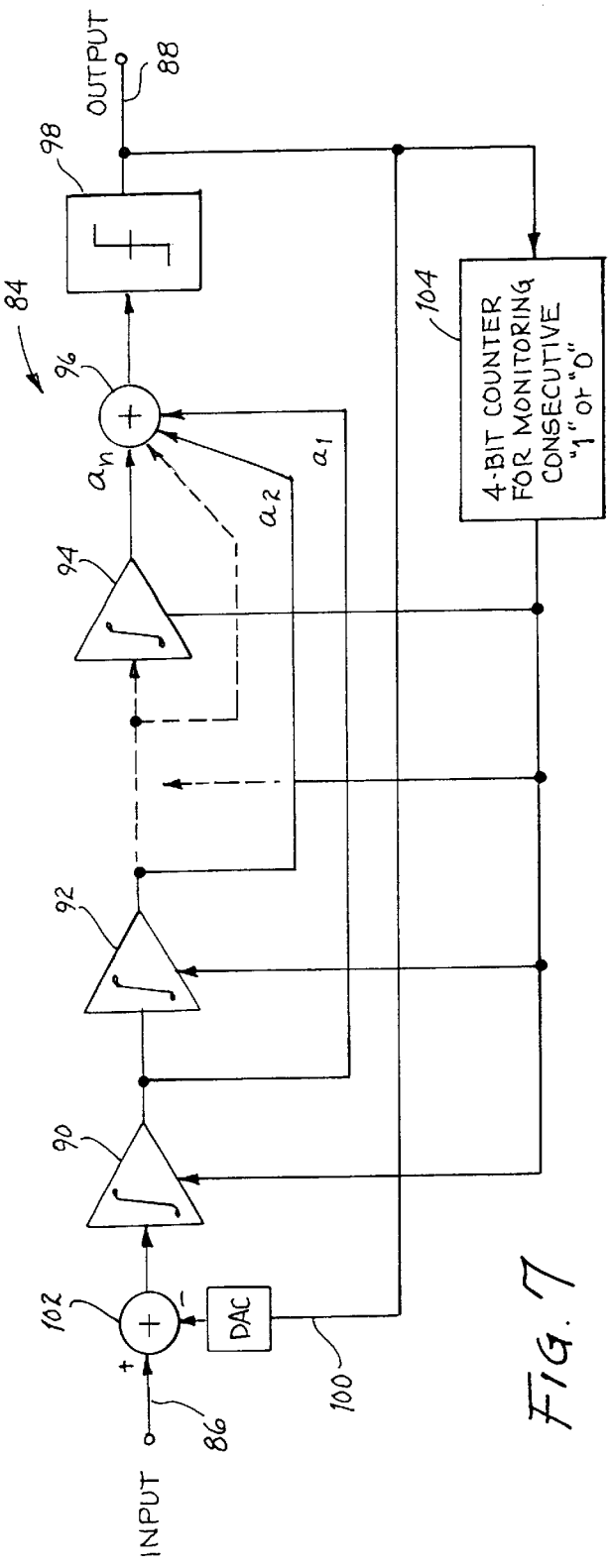
FIG. 7 is diagram of a delta-sigma modulator circuit for an A/D converter comprising a plurality of integrator stages according to embodiments of the present invention.

FIG. 7 includes a circuit diagram of a delta-sigma modulator circuit 84 for use in an A/D converter circuit. The modulator circuit 84 comprises an input conductor 86, an output conductor 88, a plurality of integrator stages 90, 92 and 94 coupled in series, and a feedforward conductor $a_1$, $a_2$ and $a_n$ coupled to the output of each integrator stage 90, 92 and 94. The feedforward conductors $a_1$, $a_2$ and $a_n$ are each coupled to a first summing junction 96, the output of which is coupled to the input of a quantizer 98. In place of a quantizer 98, any device which generates a digital output in response to an analog input would suffice, such as, but not limited to, a comparator, a 1-bit A/D converter, and the like.

The output of the quantizer 98 is coupled to the output conductor 88. The output conductor 88 is coupled to a feedback conductor 100 which is also coupled through a DAC 101 to a second summing junction 102 with the input conductor 86. The output of the second summing junction 102 is coupled to the input of the first integrator stage 90.

Figure 8:
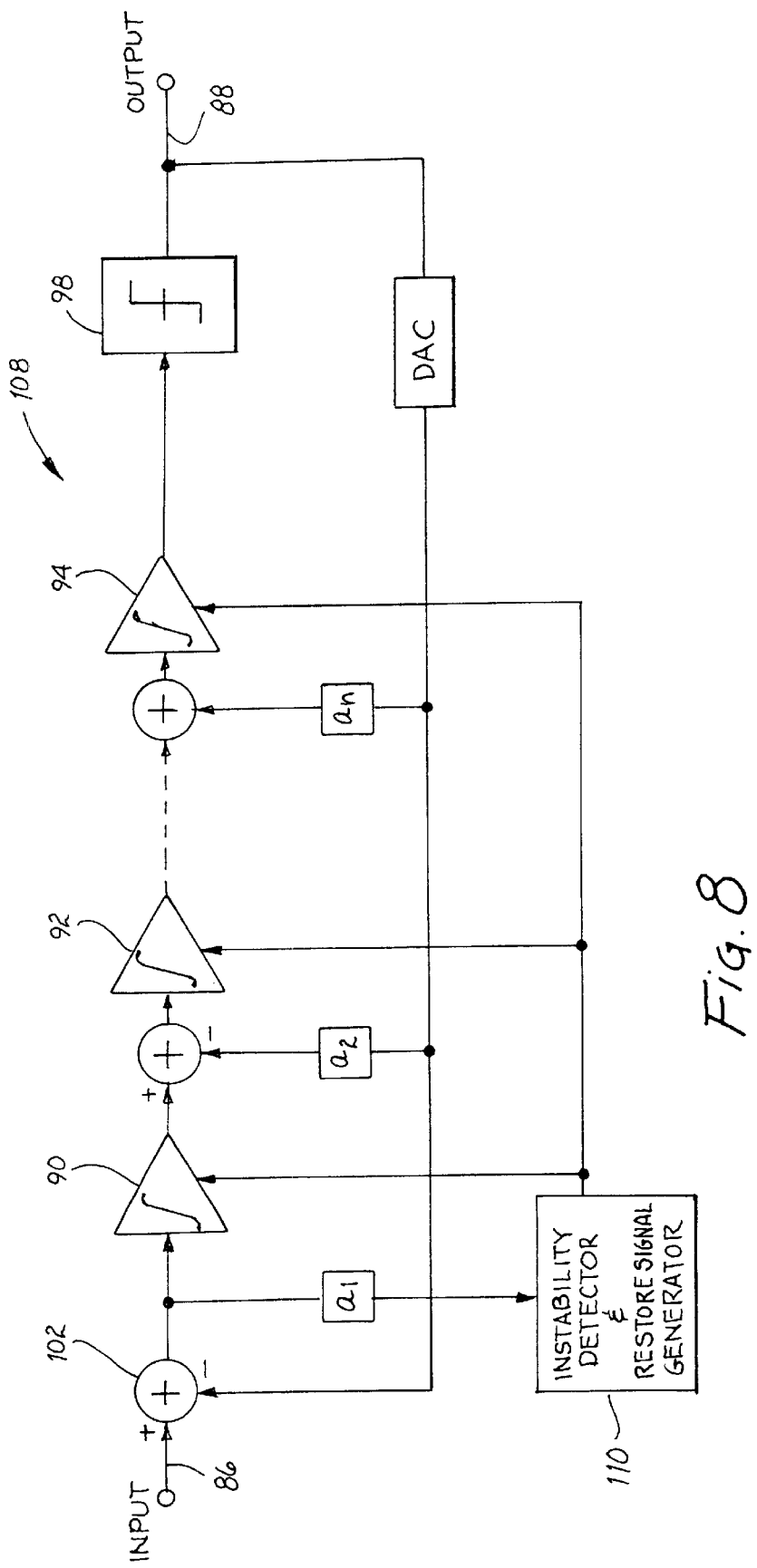
FIG. 8 is another diagram of a delta-sigma modulator circuit for an A/D converter comprising a plurality of integrator stages according to embodiments of the present invention and having different layout than the delta-sigma modulator circuit shown in FIG. 7.

Instability detector and restore circuitry is also included in the modulator circuit for monitoring the operating characteristics of the modulator to determine if the modulator is operating at or near an unstable condition. When it is determined that the modulator is at or near an unstable condition, a restore signal is generated to selectively restore particular integrator stages. The criteria for determining an unstable condition may be embodied as fixed threshold values, or variable threshold values, or combinations of values such as an input level beyond a threshold for a number of cycles. For the embodiment shown in FIG. 7, the output conductor 88 is also coupled to the input of a 4-bit counter 104, including necessary logic circuitry for monitoring consecutive "1s" and "0s" on the output conductor 88. The output of the 4-bit counter 104 is coupled to each of the integrator stages 90, 92 and 94 for selectively restoring the integrator stages 90, 92 and 94 to stable conditions. It will be clear to one of ordinary skill in the art that the operating characteristics of the modulator may be monitored at any point within the modulator circuit such as at the input, at the output, or at the input or output of any integrator stage. FIG. 8 illustrates an embodiment wherein circuitry 110 for detecting instability and generating a restore signal is coupled near the input 86 rather than to the output 88.

FIG. 8 also illustrates another embodiment of the modulator circuit 108 wherein the feedforward paths of the circuit of FIG. 7 are eliminated and feedback paths $a_1$, $a_2$ and $a_n$ are used. Other configurations will also be evident to those of ordinary skill in the art. One of ordinary skill in the art will also understand that in certain applications, it may not be necessary to restore all of the integrator stages to stable conditions, and that restoring one or more of the integrator stages to a stable condition may be sufficient to stabilize the loop. For example, it may be desirable to restore all of the integrator stages but the first stage. In such case, the logic circuitry within the counter 104 or other detector circuit may be readily configured to selectively restore all but the first stage 90, or the modulator circuit 84 may be configured such that the first stage 90 does not receive a generated restore signal.

As indicated by the dashed lines in both FIGS. 7 and 8, the present invention is not limited to a particular number of integrator stages, and many more integrator stages may be implemented according to the required transfer function of a particular application. It is believed that one of ordinary skill in the art may design and implement particular modulator circuits according to embodiments of the present invention from the descriptions herein.

Figure 9:
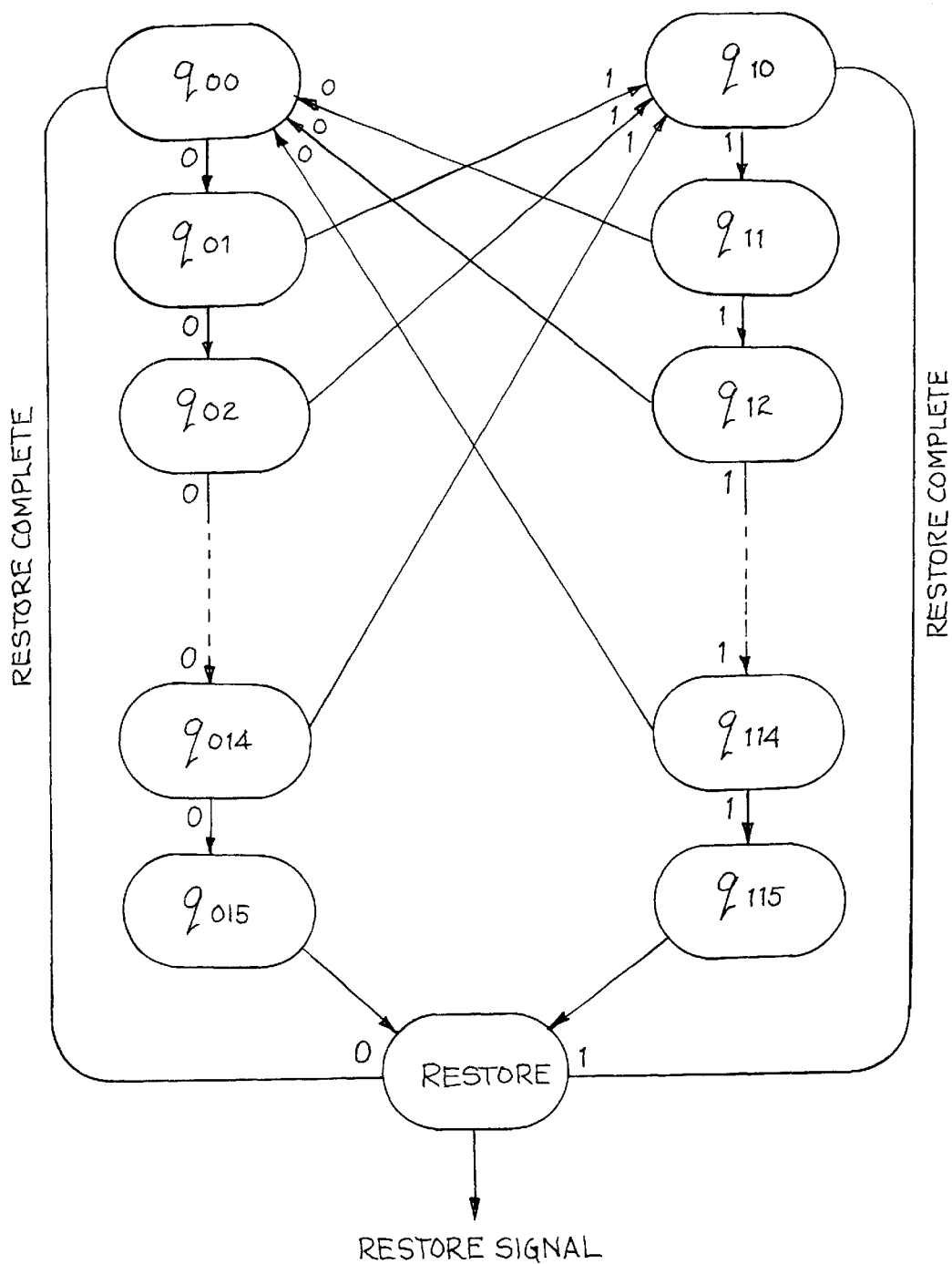
FIG. 9 is a state flow diagram describing the state transitions of an embodiment of the 4-bit counter of FIG. 7.

FIG. 9 is a state flow diagram of one embodiment of a 4-bit counter for use in the modulator circuit 84 of FIG. 7. The 4-bit counter 104 of FIG. 7 monitors the signals on the output conductor 88 to determine the stability of the modulator output bit stream. Conventionally, the output of a modulator circuit operating within expected parameters has a maximum "ran length" of 1s or 0s anywhere from 6 to 10 bits in a row. For run lengths sufficiently longer than 10 consecutive 1s or 0s in a row, it may be determined with some certainty that the modulator circuit 84 has overloaded, is oscillating, and needs to be restored to a stable condition. The 4-bit counter 104 of FIG. 7 is coupled to the output conductor 88 to count the number of consecutive 1s and 0s and responsively generate a restore signal if the number of consecutive 1s or 0s ever reaches sixteen. The restore signal is sent to each of the integrator stages 90, 92 and 94 to appropriately restore the various integrator stages 90, 92 and 94 to stable conditions. It will be clear to one of ordinary skill in the art that the number of consecutive 1s or 0s at which the restore signal is generated may be higher or lower than sixteen depending on the requirements for a particular application. Using sixteen here is only intended to indicate one example of a threshold at which an unstable condition may be detected with some certainty.

As shown in FIG. 9, for a counter implemented as a state machine, upon detecting each consecutive 1 or 0, the state machine increments from an initial state $q_{00}$ or $q_{10}$ sequentially toward a final counter state $q_{015}$ or $q_{115}$ after 16 consecutive 1s or 0s. Once the state machine reaches the final counter state $q_{015}$ or $q_{115}$, the state machine responsively advances to a restore state in which it remains for a number of cycles sufficient to allow each of the integrator stages 90, 92 and 94 to arrive at stable states. The number of cycles for which the state machine remains in the restore state may be a fixed number, or may vary in relation to any number of factors such as the severity of the instability and whether stability has been achieved. It is believed that one of ordinary skill in the art will readily be able to implement an appropriate counter from the foregoing description.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. An analog-to-digital converter modulator circuit comprising:
    an input conductor;
    an output conductor;
    at least one integrator stage having:
        an operational amplifier comprising
            a first restore switch coupled between an inverting input and a non-inverting input; and
            a second restore switch coupled between an inverting output and a non-inverting output;
        a first integrating capacitor coupled between the inverting input and non-inverting output; and
        a second integrating capacitor coupled between the non-inverting input and inverting output;
        a feedforward conductor coupled to the outputs of each integrator stage;
        a first summing junction configured to receive and sum data signals carried on the feedforward conductors, and to generate an output signal on the output conductor;
        a second summing junction configured to receive and sum data signals carried on the input conductor and a feedback conductor coupled to the output conductor and to generate an output signal to an input of one of the at least one integrator stage; and
    an unstable condition detector coupled to the output conductor and configured to generate a signal to activate each of the first and second restore switches upon detection of an unstable condition on the output conductor.

2. The analog-to-digital converter modulator circuit of claim 1, wherein the unstable condition detector comprises:
    a quantizer configured to receive an analog output from the first summing junction and generate a corresponding digital output; and
    a consecutive input counter configured to monitor a number of consecutive 1s and a number of consecutive 0s among the digital output of the quantizer and generate an unstable condition signal when a predetermined number of consecutive 1s or 0s is reached.

3. The analog-to-digital converter modulator circuit of claim 2, wherein the consecutive input counter is a 4-bit consecutive input counter.

4. The analog-to-digital converter modulator circuit of claim 1, wherein the modulator circuit is configured as a delta-sigma modulator circuit.

5. An integrator stage of an analog-to-digital modulator circuit, the integrator stage comprising:
    an amplifier having an inverting input, a non-inverting input, an inverting output and a non-inverting output;
    a first integrating capacitor coupled between the inverting input and the non-inverting output;
    a second integrating capacitor coupled between the non-inverting input and the inverting output;
    a first restore switch coupled between the inverting input and the non-inverting input; and
    a second restore switch coupled between the inverting output and the non-inverting output.

6. The integrator stage of claim 5, further comprising:
    a first disconnect switch coupled between the first restore switch and the inverting input;
    a second disconnect switch coupled between the first restore switch and the non-inverting input;
    a third disconnect switch coupled between the second restore switch and the inverting output; and
    a fourth disconnect switch coupled between the second restore switch and the non-inverting output.

7. A method for operating a delta-sigma modulator circuit, the method comprising:
    monitoring an output of the modulator circuit for instability; and
    activating a first restore switch across inputs and a second restore switch across outputs of at least one integrator stage in response to detecting instability.

8. The method of claim 7, further comprising:
    activating a first disconnect switch coupled between the first restore switch and an inverting input of an operational amplifier;
    activating a second disconnect switch coupled between the first restore switch and a non-inverting input of the operational amplifier;
    activating a third disconnect switch coupled between the second restore switch and an inverting output of the operational amplifier; and
    activating a fourth disconnect switch coupled between the second restore switch and a non-inverting output of the operational amplifier.

9. The method of claim 7, wherein monitoring for instability comprises monitoring a number of consecutive 1s and a number of consecutive 0s on an output of the modulator circuit; and wherein the first and second restore switches are activated in response to detecting a predetermined number of consecutive 1s or a predetermined number of consecutive 0s at the output of the modulator circuit.

10. The method of claim 9, further comprising:
    converting an analog output of the modulator circuit to a corresponding digital output;

incrementing a first counter for each consecutive 1 on the output and incrementing a second counter for each consecutive 0 on the output; and generating a restore switch activating signal in response to either the first or second counters reaching a predetermined counter threshold.

11. The method of claim 10, wherein the first and second counters are the same counter.

12. A method for restoring an integrator stage, the method comprising:

receiving a restore signal; and activating a first restore switch across inputs and a second restore switch across outputs of at least one integrator stage in response to the restore signal.

13. The method of claim 12, further comprising:

activating a first disconnect switch coupled between the first restore switch and an inverting input of an operational amplifier;

activating a second disconnect switch coupled between the first restore switch and a non-inverting input of the operational amplifier;

activating a third disconnect switch coupled between the second restore switch and an inverting output of the operational amplifier; and activating a fourth disconnect switch coupled between the second restore switch and a non-inverting output of the operational amplifier.

14. An analog-to-digital converter modulator circuit comprising:

an input conductor;

an output conductor;

a summing junction configured to sum a signal on the input conductor with a sample of a signal on the output conductor carried by a feedback conductor, and to generate an output signal;

a plurality of integrator stages coupled between the input and the output, each stage having:

an operational amplifier comprising:

a first restore switch coupled between an inverting input and a non-inverting input; and a second restore switch coupled between an inverting output and a non-inverting output;

a first integrating capacitor coupled between the inverting input and non-inverting output; and a second integrating capacitor coupled between the non-inverting input and inverting output;

converter circuitry configured to receive an analog output from a last of the plurality of integrator stages and convert the analog output to a digital output on the output conductor; and monitoring circuitry coupled to a portion of the modulator circuit and configured to monitor at least one circuit operating characteristic and generate a restore signal for activating each of the first and second restore switches.

15. The modulator circuit of claim 14, wherein the monitoring circuitry comprises an unstable condition detector and is coupled to the output conductor.

16. The analog-to-digital converter modulator circuit of claim 15, wherein the unstable condition detector comprises a consecutive input counter configured to monitor a number of consecutive 1s and a number of consecutive 0s among the digital output of the quantizer and generate an unstable condition signal when a predetermined number of consecutive 1s or 0s is reached.

17. The analog-to-digital converter modulator circuit of claim 16, wherein the consecutive input counter is a 4-bit consecutive input counter.

18. The analog-to-digital converter modulator circuit of claim 14, wherein the modulator circuit is configured as a delta-sigma modulator circuit.

* * * * *